United States Patent [19]

Higaki et al.

[11] Patent Number: 5,114,906
[45] Date of Patent: May 19, 1992

[54] PROCESS FOR DEPOSITING TL-CONTAINING SUPERCONDUCTING THIN FILMS ON (110) MGO SUBSTRATES

[75] Inventors: Kenjiro Higaki; Keizo Harada; Naoji Fujimori; Hideo Itozaki; Shuji Yazu, all of Hyogo, Japan

[73] Assignee: Sumitomo Electric Industries, Ltd., Osaka, Japan

[21] Appl. No.: 663,451

[22] Filed: Mar. 4, 1991

Related U.S. Application Data

[62] Division of Ser. No. 367,736, Jun. 19, 1989, Pat. No. 4,997,813.

[30] Foreign Application Priority Data

Jun. 17, 1988 [JP] Japan .................................. 63-149414

[51] Int. Cl.$^5$ .......................... B05D 5/12; C23C 14/00
[52] U.S. Cl. ........................................ 505/1; 505/731; 505/732; 427/62; 427/126.3; 427/255.3; 427/314; 204/192.24
[58] Field of Search .................... 505/1, 783, 731, 732, 505/742; 427/62, 63, 314, 126.3, 255.3; 204/192.24

[56] References Cited

FOREIGN PATENT DOCUMENTS 64-73776 3/1989 Japan .

OTHER PUBLICATIONS

Nakao et al., "Sputtered Tl–Ca–Ba–Cu–O Thin films with zero resistivity at 98K", Jpn. J. Appl. Phys. vol. 27 (5) May 1988 L849-851.
Zhou et al., "Preparation of Superconducting $Tl_1 Ba_2 Ca_3 Cu_4 O_x$ Thin films by RF magnetron sputtering", Jpn. J. Appl. Phys. vol. 27(12) Dec. 1988 L2321-2323.
Shih et al., "Multilayer deposition of Tl–Ba–Ca–Cu–O films", Appl. Phys, lett. 53(6) Aug. 1988 pp. 523-525.

*Primary Examiner*—Shrive Beck
*Assistant Examiner*—Roy V. King
*Attorney, Agent, or Firm*—Kerkam, Stowell, Kondracki & Clarke

[57] ABSTRACT

Improvement in a superconducting thin film of a superconducting compound oxide containing thallium (Tl) deposited on a substrate, characterized in that the superconducting thin film is deposited by PVD on {110} plane of a single crystal of magnesium oxide (MgO).

14 Claims, No Drawings

PROCESS FOR DEPOSITING TL-CONTAINING SUPERCONDUCTING THIN FILMS ON (110) MGO SUBSTRATES

This is a division of application Ser. No. 07/367,736 filed Jun. 19, 1989, now U.S. Pat. No. 4,997,813.

BACKGROUND OF THE INVENTION

1. Field of the Invention

The present invention relates to a superconducting thin film and a process for depositing the same on a substrate.

More particularly, it relates to a thallium (Tl) type superconducting thin film possessing an improved high critical current density (Jc) as well as a high critical temperature (Tc) and a process for depositing the same on a substrate.

2. Description of the Related Art

The superconductivity is a phenomenon which is explained to be a kind of phase change of electrons under which the electric resistance become zero and the perfect diamagnetism is observed.

Several superconducting devices have been proposed and developed in electronics which is a typical field to which the superconducting phenomenon is applicable. A typical application of the superconductor is Josephson device in which quantum efficiency is observed macroscopically when an electric current is passed through a weak junction arranged between two superconductors. The tunnel junction type Josephson device is expected to be a high-speed and low-power consuming switching device owing to smaller energy gap of the superconducting material. It is also expected to utilize the Josephson device as a high-sensitive sensor or detector for sensing very weak magnetic field, microwave, radiant ray or the like since variation of electromagnetic wave or magnetic field is reflected in variation of Josephson effect and can be observed as a precise quantum phenomenon. Development of the superconducting devices such as high-speed logic units or of no power-loss wiring materials is also demanded in the field of high-speed computers in which the power consumption per unit area is reaching to the upper limit of the cooling capacity with increment of the integration density in order to reduce energy consumption. The critical temperature "Tc" of superconductivity, however, could not exceed 23.2K of $Nb_3Ge$ which was the the highest Tc for the past ten years.

The possibility of an existence of new types of superconducting materials having much higher Tc was revealed by Bednorz and Müller, who discovered a new oxide type superconductor in 1986 (Z. Phys. B64, 1986 p189).

It had been known that certain ceramic materials of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi-Pb type compound oxides also show superconductivity. These superconductors, however, possess rather lower transition temperatures of about 10K and hence usage of liquidized helium (boiling point of 4.2K) as cryogen is indispensable to realize superconductivity.

The new type compound oxide superconductor discovered by Bednorz and Müller is represented by [La, Sr]$_2$CuO$_4$ which is called the $K_2NiF_4$-type oxide having a crystal structure which is similar to known perovskite type oxides. The $K_2NiF_4$-type compound oxides show such higher Tc as 30K which are extremely higher than known superconducting materials.

It was also reported that C. W. Chu et al. discovered, in the United States of America, another superconducting material so called YBCO type represented by $YBa_2Cu_3O_{7-x}$ having the critical temperature of about 90K in February 1987 (Physical Review letters, Vol. 58, No. 9, p908).

The other type new superconducting materials which were reported recently are a compound oxide of Bi-Sr-Ca-Cu-O system reported by Maeda et al (Japanese Journal of Applied Physics. Vol. 27, No. 2, p 1209 to 1210) and Tl-Ba-Ca-Cu-O system which exhibit such high Tc as more than 100K (Hermann et al. Appl. Phys. Lett. 52 (20) p1738) and which are chemically much stable than the abovementioned YBCO type compound oxide or the like. And hence, the possibility of an actual utilization of the high Tc superconductors have burst onto the scene.

The above-mentioned new types superconducting materials were prepared in a bulk form of sintered block which was obtained by sintering a powder mixture of oxides or carbonates of constituent metal elements. They can be deposited on a substrate in a form of a thin film by physical vapour deposition (PVD) technique or chemical vapor deposition (CVD) technique. In both cases, it is a usual practice to subject the resulting sintered blocks or thin films to heat-treated in an oxygen-containing atmosphere to adjust the oxygen deficiency in the crystal.

The present applicant already proposed several processes for preparing the thin films of the high-Tc superconductor on a substrate in the following commonly assigned patent applications: U.S. patent application Ser. No. 152,714 filed on Feb. 2, 1988, now U.S. patent application Ser. No. 167,895 filed on Mar. 13, 1988, now abandoned, U.S. patent application Ser. No. 195,145 filed on May 18, 1988, now U.S. Pat. No. 4,900,716, U.S. patent application Ser. No. 195,147 filed on May 18 1988, now abandoned U.S. patent application Ser. No. 200,206 filed on May 31, 1988, now U.S. Pat. No. 4,996,185, U.S. patent application Ser. No. 286,860 filed on Dec. 20, 1988, now U.S. Pat. No. 5,028,583, U.S. patent application Ser. No. 289,718 filed on Dec. 25, 1988, now abandoned U.S. patent application Ser. No. 289,719 filed on Dec. 25, 1988, and U.S. patent application Ser. No. 290,309 filed on Dec. 26, 1988 now abandoned, or the like. The present invention completed on the same line as these patent applications.

The present invention concerns the superconducting thin films of thallium (Tl) type compound oxide. This type superconducting thin film has been prepared by deposition techniques such as RF sputtering, vacuum deposition or MO-CVD technique. They posses, however, very low critical current density (Jc) although they showed very high critical temperature (Tc), so that they were difficult to be utilized in practical uses.

An object of the present invention is to overcome the conventional thallium (Tl) type superconducting thin films and to improve the critical current density (Jc) and a process for preparing the same.

SUMMARY OF THE INVENTION

The present inventors found such a fact that the critical current density (Jc) of the superconducting thin film of thallium (Tl) type compound oxide can be improved remarkably when the thin film is deposited on {110} plane of a single crystal of magnesium oxide (MgO) comparing to known thin films prepared by the conventional process in which the thin film is deposited on {100} plane of MgO. In fact, the highest critical current density (Jc) observed in the known thin film of thallium (Tl) type compound oxide deposited on {100} plane has been about 10,000 A/cm$^2$ which is inadequate for practical applications.

Therefore, the present invention provides a superconductor comprising a substrate and a superconducting thin film of a superconducting compound oxide containing thallium (Tl) deposited on the substrate, characterized in that the superconducting thin film is deposited on {110} plane of a single crystal of magnesium oxide (MgO).

The present invention also provides a process for producing the superconductor. The process according to the present invention for depositing the superconducting thin film of compound oxide containing thallium (Tl) by vapour deposition on a substrate is characterized in that the superconducting thin film is deposited on {110} plane of a single crystal of magnesium oxide (MgO).

The superconducting thin film according to the present invention consists preferably of a superconducting compound oxide of thallium (Tl), barium (Ba), calcium (Ca) and copper (Cu).

The superconducting thin film according to the present invention can be deposited on a substrate by physical vapour deposition (PVD) technique such as RF sputtering, vacuum deposition, ion-plating, MBE or chemical vapor deposition (CVD) technique such as thermal CVD, plasma CVD, photo CVD, MOCVD or the like.

The vapour source used in the vapour deposition can consist of elemental thallium (Tl), barium (Ba), calcium (Ca) and copper (Cu) and/or compounds thereof, so that thallium (Tl), barium (Ba), calcium (Ca) and copper (Cu) are deposited together with oxygen (O) on the substrate to produce the superconducting compound oxide.

The atomic ratios of these elements: Tl, Ba, Ca and Cu are adjusted in such a manner that a thin film deposited on the substrate has a predetermined composition which shows superconductivity with taking evaporation rates and volatility of each elements into consideration.

According to a preferred embodiment, the vapour source is prepared by the steps of mixing firstly powders of compounds of Ba, Ca and Cu such as their oxides, carbonates, fluorides or the like, subjecting the resulting powder mixture of compounds of Ba, Ca and Cu to preliminary sintering operation, pulverizing the resulting preliminary sintered mass and then mixing the resulting preliminary sintered powder with a powder of a compound of Tl such as thallium oxides, carbonates, fluorides or the like to obtain a material powder mixture which can be used directly as a vapour source, particularly, as a target for sputtering. This preparation method is very effective because thallium is a vary volatile and toxic element.

The vapour source can be divided into a plurality of segments each consisting of elemental metal of Tl, Ba, Ca and Cu or a compound thereof such as their oxides, carbonates, fluorides or the like which can be evaporated by means of a K-cell or an ion beam. This vapour source is preferable for vacuum deposition, ion-plating or molecular beam epitaxy (MBE) methods. In this case, oxygen is supplied, if necessary, separately or additionally into an evaporation atmosphere.

Generally speaking, supplement of oxygen into the evaporation atmosphere is effected either by evaporating oxygen-containing compounds such as oxides, carbonates, fluorides of Tl, Ba, Ca and Cu or by supplying oxygen gas separately into a vacuum chamber. In any case, the oxygen contents in the atmosphere during the deposition of the superconducting thin film must be controlled precisely so that the oxygen deficiency in the thin film deposited on the substrate is adjusted to a predetermined value because the oxygen deficiency in the thin film is a critical factor to realize the superconducting property.

The thin film according to the present invention consists preferably of a superconducting compound oxide represented by the general formula:

$$Tl_4(Ba_{1-x}Ca_x)_mCu_nO_{p+y}$$

in which m, n, x and y are numbers each satisfying ranges of $6 \leq m \leq 10$, $4 \leq n \leq 8$ $0 < x < 1$ and $-2 \leq y \leq +2$, respectively and $p=(6+m+n)$.

More preferably, the atomic ratios are selected within one of following ranges:
(i) $7 \leq m \leq 9$, $5 \leq n \leq 7$ and $0.4 \leq x \leq 0.6$,
(ii) $6 \leq m \leq 7$, $4 \leq n \leq 5$ and $0.2 \leq x \leq 0.4$,
(iii) $9 \leq m \leq 10$, $7 \leq n \leq 8$ and $0.5 \leq x \leq 0.7$.

Results of experiments which were carried out by the present inventors revealed such a fact that the crystalline structure of a superconducting thin film of thallium (Tl) type compound oxide deposited on {110} plane of a single crystal of magnesium oxide (MgO) is much uniform than a superconducting thin film of thallium (Tl) type compound oxide deposited on {100} plane of the same single crystal and is free from precipitates which is thought to be a cause of hindrance to a flow of electrons. The reason why the thin film according to the present invention possesses a very high current density (Jc) may be explained by the absence or decrement of such precipitation.

In order to obtain a smooth thin film which is uniform in crystal structure, it is indispensable to heat the substrate at a temperature which is higher than 50° C., preferably higher than 100° C. during the deposition. The temperature of the substrate, however, should not be heated higher than 400° C. during the deposition. Heating of the substrate at higher temperature than 400° C. result in increment of precipitates on the thin film deposited and hence both of the critical current density (Jc) and the critical temperature (Tc) become lower.

It is also preferable to subject the resulting thin film deposited on the substrate to heat-treatment in a stream of mixed gas of oxygen and thallium. This heat-treatment is effected preferably by such steps that the resulting thin film deposited on the substrate is firstly reheated at a heating rate of 1° to 5° C./min to a temperature of 800° to 910° C., is maintained at this temperature for 10 minutes to 100 hours, and then is cooled slowly to ambient temperature at a cooling rate of 1° to 5° C./min. This heat-treatment accelerate homogenization of crystal structure in the thin film and ensure the oxygen deficiency of the crystal structure. In order to realize the effect of the heat-treatment, it is preferable to operate the heat-treatment by the above-mentioned steps.

The superconducting compound oxide according to the present invention can be utilized advantageously in a variety of applications of thin film devices, such as Matisoo switching elements or Josephson device, Anacker memory device, a variety of sensors or Superconducting Quantum Interference Device (SQUID).

Now, the present invention will be described with reference to examples, but the scope of the invention should not be limited to them.

EXAMPLE 1

In this example, a superconducting thin film of Tl-Ba-Ca-Cu type compound oxide according to the present invention is prepared by RF-magnetron sputtering method.

A target used in the RF-magnetron sputtering is prepared by the steps of mixing intimately powders of commercially available $BaCO_3$, $CaCO_3$ and CuO in such a manner that the atomic ratios of respective elements Ba, Ca and Cu in the resulting powder mixture become 2:2:3, subjecting the powder mixture to sintering at 820° C. for 8 hours, pulverizing the sintered mass, and then mixing a powder of commercially available $Tl_2O_3$ with the resulting pulverized preliminary sintered powder in such a manner that the atomic ratios of Tl, Ba, Ca and Cu become 1:2:2:3 to obtain a powder mixture target which is used directly as the target.

The RF-magnetron sputtering is effected under the following conditions:

| | |
|---|---|
| Substrate: | {110} plane of a single crystal of MgO |
| Sputtering gas: | a mixed gas of Ar and $O_2$ |
| | $O_2/(Ar + O_2) = 0.2$ (vol) |
| Sputtering pressure: | $2 \times 10^{-2}$ Torr |
| Substrate temperature: | 200° C. |
| High-frequency power: | 50 W (0.64 W/cm$^2$) |

Deposition of a thin film is continued up to a thickness of 8,000 Å. Then, the resulting thin film is heat-treated in a stream of a mixed gas of oxygen and thallium. This heat-treatment is effected by the steps of re-heating the thin film deposited on the substrate up to 900° C. at a rate of 3° C./min, maintaining the temperature for one hour and then cooling the thin film slowly down to ambient temperature at a cooling rate of 3° C./min.

The resulting thin film is analyzed to find that the atomic ratios of Tl:Ba:Ca:Cu in the thin film are 2:2:2:3.

For comparison, the same procedure (same target and same operational condition as above) is repeated except that the thin film is deposited on {100} plane of a single crystal of MgO.

The resulting superconducting thin films are evaluated by measuring the critical temperature, the critical current density and by observing their surfaces by a scanning electron microscope (SEM).

The critical temperatures (Tco where the superconducting phenomenon starts to be observed and Tci where the perfect superconductivity is realized) are determined on both samples of thin films by usual four probe method. Temperature is measured by a calibrated Au(Fe)-Ag thermocouple. The critical current density (Jc) of the thin films obtained is also determined at 77.0K and is expressed by A/cm$^2$.

The results are summarized in Table 1.

EXAMPLE 2

Same operation as Example 1 is repeated except that the atomic ratios of Tl:Ba:Ca:Cu in the powder target is modified to 2:2:1:2.

The resulting thin film is analyzed to find that the atomic ratios of Tl:Ba:Ca:Cu in the thin film are 2:2:1:2.

The superconducting properties of the resulting thin films are determined by the same method as Example 1. The results are summarized in Table 1.

EXAMPLE 3

In this example, a superconducting thin film of Tl-Ba-Ca-Cu type compound oxide according to the present invention is prepared by vacuum deposition method.

A vapour source used in the vacuum deposition is divided into four segments consists of commercially available thallium (Tl) metal, calcium (Ca) metal, copper (Cu) metal and $BaF_2$. The thallium (Tl) metal, calcium (Ca) metal and copper (Cu) metal are evaporated in respective K-cell, while $BaF_2$ is evaporated by means of an electron beam (EB) gun. The vacuum deposition is effected under the following conditions:

| | |
|---|---|
| Substrate: | {110} plane of a single crystal of MgO |
| Oxygen partial pressure: | $2 \times 10^{-6}$ Torr |
| Substrate temperature: | 300° C. |
| Film forming rate: | 5 Å/sec |

Deposition of a thin film is continued up to a thickness of 8,000 Å. Then, the resulting thin film deposited on the substrate is heat-treated in a stream of a mixed gas of oxygen and thallium. This heat-treatment is effected by the steps of re-heating the thin film deposited on the substrate up to 900° C. at a rate of 3° C./min, maintaining the temperature for one hour and then cooling the thin film slowly down to ambient temperature at a cooling rate of 3° C./min.

The resulting thin film is analyzed to find that the atomic ratios Tl:Ba:Ca:Cu in the thin film are 2:2:2:3.

For comparison, the same procedure (same target and same operational condition as above) is repeated except that the thin film is deposited on {100} plane of a single crystal of MgO.

The critical temperatures (Tco and Tci) and the critical current density (Jc) are determined by the same method as Example 1. The results are summarized in Table 1.

EXAMPLE 4

Same operation as Example 3 is repeated except that the amounts of Ca and Cu to be evaporated are reduced by controlling heating means in such a manner that the atomic ratios of Tl:Sr:Ca:Cu which is analyzed in the resulting thin film become to 2:2:1:2.

The superconducting properties of the resulting thin films are determined by the same method as Example 1. The results are summarized in Table 1.

TABLE 1

| | | Plane | |
|---|---|---|---|
| Example No | | Present invention {110} | Comparative {100} |
| 1 | Tco (K) | 118 | 120 |
| | Tci (K) | 110 | 115 |
| | Jc (A/cm$^2$) | $4.3 \times 10^5$ | $1.2 \times 10^4$ |
| 2 | Tco (K) | 103 | 105 |
| | Tci (K) | 95 | 98 |
| | Jc (A/cm$^2$) | $1.8 \times 10^4$ | $3.3 \times 10^2$ |
| 3 | Tco (K) | 119 | 120 |
| | Tci (K) | 111 | 114 |
| | Jc (A/cm$^2$) | $2.8 \times 10^5$ | $9.5 \times 10^3$ |
| 4 | Tco (K) | 100 | 105 |
| | Tci (K) | 93 | 98 |

TABLE 1-continued

| Example No | Plane | |
|---|---|---|
| | Present invention {110} | Comparative {100} |
| Jc (A/cm$^2$) | $2.5 \times 10^4$ | $2.1 \times 10^2$ |

From the results of Examples, it is confirmed that the superconducting thin films according to the present invention possess remarkably higher critical current density (Jc) than the conventional ones.

The surface smoothness of the superconducting thin films obtained is observed by a scanning electron microscope (SEM). The results revealed that the thin film according to the present invention has much homogeneous and uniform smooth surface than the film prepared by the conventional process. This fact is a support of the reason why the thin film according to the present invention possesses higher critical current density.

We claim:

1. Process for depositing a superconducting thin film of a compound oxide containing thallium (Tl) by vapour deposition on a substrate, characterized in that said superconducting thin film is deposited on {110} plane of a single crystal of magnesium oxide (MgO).

2. The process set forth in claim 1 wherein said substrate is heated at a temperature which is not higher than 400° C. during the deposition.

3. The process set forth in claim 1 wherein a thin film deposited on the substrate is subjected to heat-treatment after the deposition.

4. The process set forth in claim 3 wherein the heat-treatment is effected in a stream of mixed gas of oxygen and thallium.

5. The process set forth in claim 1 wherein a vapour source used in the vapour deposition consists of elemental thallium (Tl), barium (Ba), calcium (Ca) and copper (Cu) and/or compounds thereof, so that thallium (Tl), barium (Ba), calcium (Ca) and copper (Cu) are deposited together with oxygen (O) on said substrate to produce said superconducting compound oxide.

6. The process set forth in claim 5 wherein said superconducting thin film deposited on the substrate consists of a superconducting compound oxide represented by the general formula:

$$Tl_4(Ba_{1-x}, Ca_x)_m Cu_n O_{p+y}$$

in which m, n, x and y are numbers each satisfying ranges of $6 \leq m \leq 10$, $4 \leq n \leq 8$, $0 < x < 1$ and $-2 \leq y \leq +2$, respectively, and $p = (6+m+n)$.

7. The process set forth in claim 1 wherein said vapour deposition is carried out by physical vapour deposition method.

8. The process set forth in claim 7 wherein said physical vapour deposition method is sputtering.

9. The process set forth in claim 8 wherein a target used in said sputtering a powder target which is prepared by the steps of mixing compounds of Ba, Ca and Cu, subjecting the resulting mixture of compounds of Ba, Ca and Cu to preliminary sintering operation, pulverizing the resulting preliminary sintered mass, and then mixing the resulting preliminary sintered powder with a compound of Tl to obtain the powder target.

10. The process set forth in claim 9 wherein each of said compounds of Tl, Ba, Ca and Cu is oxygen-containing compound.

11. The process set forth in claim 10 wherein each of said oxygen-containing compounds is selected from oxides, carbonates, nitrates, fluorides of Tl, Ba, Ca and Cu.

12. The process set forth in claim 7 wherein said physical vapour deposition method is evaporation deposition.

13. The process set forth in claim 12 wherein the vapour source used in said vacuum deposition is divided into a plurality of segments each selected from elemental thallium (Tl), elemental barium (Ba), elemental calcium (Ca) and elemental copper (Cu) and compounds thereof.

14. The process set forth in claim 13 wherein each of said compounds is selected from oxides, carbonates, nitrates, fluorides of Tl, Ba, Ca and Cu.

* * * * *